United States Patent [19]

Okazawa

[11] Patent Number: 5,208,179
[45] Date of Patent: May 4, 1993

[54] METHOD OF FABRICATING PROGRAMMABLE READ ONLY MEMORY DEVICE HAVING TRENCH ISOLATION STRUCTURE

[75] Inventor: Takeshi Okazawa, Tokyo, Japan

[73] Assignee: NEC Corporation, Japan

[21] Appl. No.: 634,441

[22] Filed: Dec. 27, 1990

[30] Foreign Application Priority Data

Dec. 29, 1989 [JP] Japan .................... 1-342859

[51] Int. Cl.$^5$ ............ H01L 21/76; H01L 21/70; H01L 21/4763
[52] U.S. Cl. .................. 437/52; 437/43; 437/67
[58] Field of Search ............ 437/43, 52, 67; 148/DIG. 85, DIG. 86, DIG. 50, DIG. 109

[56] References Cited

U.S. PATENT DOCUMENTS 5,087,584 2/1992 Wadt et al. .............. 437/43

*Primary Examiner*—George Fourson
*Attorney, Agent, or Firm*—Laff, Whitesel, Conte & Saret

[57] ABSTRACT

A method of fabricating a semiconductor integrated circuit comprises the steps of selectively forming a first gate insulating film on a main surface of a semiconductor substrate. Thereafter, the following layers are formed in sequence on the substrate: a first polysilicon layer, a second gate insulating film, and a second polysilicon layer. Then, insulating trenches are formed by selectively removing the second polysilicon layer, the second gate insulating film, the first polysilicon layer, the first gate insulating film, and the semiconductor substrate. Thereafter, a BPSG film is formed over the entire surface, filling the trenches. Selectively removing the BPSG film to leave it only in the trenches. Heretofore, the phosphorus and boron contained in the BPSG evaporated in response to a heat treatment used for forming the gate SiO$_2$ film. Therefore, a portion of the evaporated phosphorus or boron was taken into the gate SiO$_2$ film which degraded the characteristics and the reliability of each PROM cell transistor. The invention grows the BPSG film after the first and second gate insulating film is formed. Hence phosphorus or boron contained in the BPSG film is not taken into both of the gate insulating films.

13 Claims, 8 Drawing Sheets

ASPECT RATIO = 2.0

METHOD OF FABRICATING PROGRAMMABLE READ ONLY MEMORY DEVICE HAVING TRENCH ISOLATION STRUCTURE

BACKGROUND OF THE INVENTION

The present invention relates to a method of fabricating a semiconductor device and, in particular, to a method of fabricating a non-volatile, programmable read-only semiconductor memory device in which each memory transistor has a floating gate.

In a semiconductor memory of this type, electrical isolation between adjacent memory elements has been ordinarily performed by using a selective-oxidation film. It is well-known, however, that memory elements can not be formed with a fine pattern (i.e., the device can not be fabricated at high integration density), due to a so-called bird's beak of selective oxidation film.

In order to solve this problem, a trench isolation structure has been proposed to isolate memory elements from each other, as disclosed in an article by K. Sekiya et al and entitled, "Trench Self-Aligned EPROM Technology", Symposium on VLSI Technology Technical Digest, 1986, pp. 87-88. A method of fabricating a floating gate type PROM using the proposed trench isolation will be described briefly with reference to FIG. 9.

As shown in FIG. 9A, formed on a P type (100-surface) silicon wafer 1 having P well 2 are a gate $SiO_2$ film 3 having thickness of 350 Å, a polysilicon (called hereinafter "poly-Si") film 4 having a thickness of 2000 Å as a floating gate, a $SiO_2$ film 5 as a mask layer, and a poly-Si film 6 having a thickness of 4000 Å as a spacer. The selective etching by the reactive-ion-etching (RIE) technique is then used to form trenches 8A and 8B, each having a width of 0.9 μm and a depth of 0.4 μm. Thereafter, boron is implanted into the substrate 1 through the trenches 8A and 8B in order to form channel stopper regions (not shown).

Then, by thermal oxidation, as shown in FIG. 9B, a $SiO_2$ film 7 is formed over the entire surface of the wafer, including the trenches 8A and 8B and, a thick $SiO_2$ film 9 is then formed by CVD (Chemical Vapor Deposition) to fill the trenches 8A and 8B.

Then, as shown in FIG. 9C, the CVD $SiO_2$ film 9 is etched back by RIE until a surface of the spacer poly-Si film 6 is exposed.

This RIE is continued until the spacer poly-Si film 6 is removed. Then, the mask $SiO_2$ film 5 on the poly-Si film 4 is removed by wet etching, resulting in the structure shown in FIG. 9D.

Then, as shown in FIG. 9E, a second gate $SiO_2$ film 10 having thickness of 200 Å is thermally grown on the poly-Si film 4, followed by forming a poly-Si film 11 as a control gate on the film 10.

Thus, the respective memory elements are isolated by the trenches with a maintaining of the flatness of the wafer surface.

It is well known that the thermally oxidized $SiO_2$ film 7 on the spacer poly-Si film 6 is etched by RIE at a speed which is lower than the speed of the CVD $SiO_2$ film 9 deposit. Therefore, the CVD $SiO_2$ film 9 and the thermal oxidation $SiO_2$ film 7 in the trenches 8A and 8B may produce a relatively large step as shown in FIG. 9C when the spacer poly-Si film 6 is exposed. In order to remove this step, both of the spacer poly-Si film 6 and the CVD $SiO_2$ film 9 are etched by RIE, since the etching rate of the film 6 is higher than the etching rate of film 9. The wet etching is then carried out to remove the mask $SiO_2$ film 5. As a result, the flat surface is obtained as shown in FIG. 9D. Since the mask $SiO_2$ film 5 is damaged during the etching of the spacer poly-Si film 6, it must be removed.

In the PROM mentioned above, the memory elements are isolated from each other by the trenches and a surface flatness is realized. However, the trenches 8 are filled with the CVD $SiO_2$ film 9. The CVD $SiO_2$ film may efficiently fill a trench having a so-called aspect ratio which is representative of a trench depth/trench width, of 0.5 or less. As mentioned above, the trench depth and trench width are 0.4 μm and 0.9 μm, respectively, and thus the aspect ratio is 0.44. Therefore, the trench can be filled effectively with the CVD $SiO_2$ film 9. However, this process requires that the aspect ratio of the trench to be made large for the following reasons:

(1) The trench width is preferred to be as small as possible in order to increase the integration density of the PROM in a chip.

(2) The trench depth must be increased with a decrease of trench width in order to prevent the occurrence of the parasitic MOS structure. FIG. 10 shows a relationship between the trench width, trench depth and the threshold voltage of the parasitic MOS structure.

On the other hand, the CVD $SiO_2$ film hardly fills the trench, in particular, the bottom of a trench when the aspect ratio becomes 0.5 or more. For example, with the aspect ratio of 2.0, a void 27 may be formed in the trench as shown in FIG. 11. As a material suitable to fill a trench having the large aspect ratio, Boro-Phospho-Silicate Glass (BPSG) containing silicon oxide, phosphorus and boron is known in the art. Moreover, the BPSG film has a reflow characteristic. Therefore, by using BPSG, the trenches 8 can be completely filled with BPSG while realizing the flatness of the surface.

However, if BPSG is used to fill the trench 8, the phosphorus and boron contained in BPSG are evaporated by the heat treatment for forming the gate $SiO_2$ film 10 and a portion of the evaporated phosphorus and/or boron is taken into the gate $SiO_2$ film 10 (see FIG. 9E). Such a gate film degrades the characteristics and the reliability of each PROM cell transistor.

SUMMARY OF THE INVENTION

Therefore, an object of the present invention is to provide a method of fabricating a semiconductor integrated circuit device having a trench isolation structure in which the trenches are filled with a BPSG film without contaminating gate insulating films.

Another object of the present invention is to provide a method of fabricating a semiconductor integrated circuit in which PROM cell transistors having floating gates are isolated from each other by trenches buried with BPSG while holding a desired surface flatness.

A method of fabricating a semiconductor integrated circuit according to the present invention comprises the steps of selectively forming a first gate insulating film on a main surface of a semiconductor substrate, forming a first polysilicon layer on the first gate insulating film, forming a second gate insulating film on a surface of the first polysilicon layer, forming a second polysilicon layer on the second gate insulating film, forming trenches for isolating elements by selectively removing the second polysilicon layer, the second gate insulating film, the first polysilicon layer, the first gate insulating film and the semiconductor substrate, forming a BPSG film over the entire surface with the filling of the trenches, and selectively removing the BPSG film to leave it only in the trenches.

Thus, the BPSG film is grown after the first and second gate insulating film is formed. These gate insulating films are covered with the associated polysilicon films. Hence, phosphorus and/or boron contained in the BPSG film is not taken into both of the gate insulating films. The degradation of characteristics and/or reliability of the device is thereby prevented. Since the BPSG film can fill the trenches having a large aspect ratio, the PROM cell can be made finer and a high threshold of the parasitic MOS structure can be maintained. Further, it is possible to make the etching rates of BPSG and SiO$_2$ substantially equal to each other by suitably selecting a concentration of boron and phosphorus which is to be contained in BPSG film. Therefore, the step of flattening the surface of PROM cell can be realized by the single step of simultaneous etching the thermally oxidized silicon film and the BPSG film. The number of manufacturing steps is thereby reduced.

BRIEF DESCRIPTION OF THE DRAWINGS

The above and other objects, advantages and features of the present invention will become more apparent from the following description taken in conjunction with the accompanying drawings, in which.

DETAILED DESCRIPTION OF THE PREFERRED EMBODIMENTS

Next, embodiments of the present invention will be described in detail, with reference to the accompanying drawings.

Figure 7:
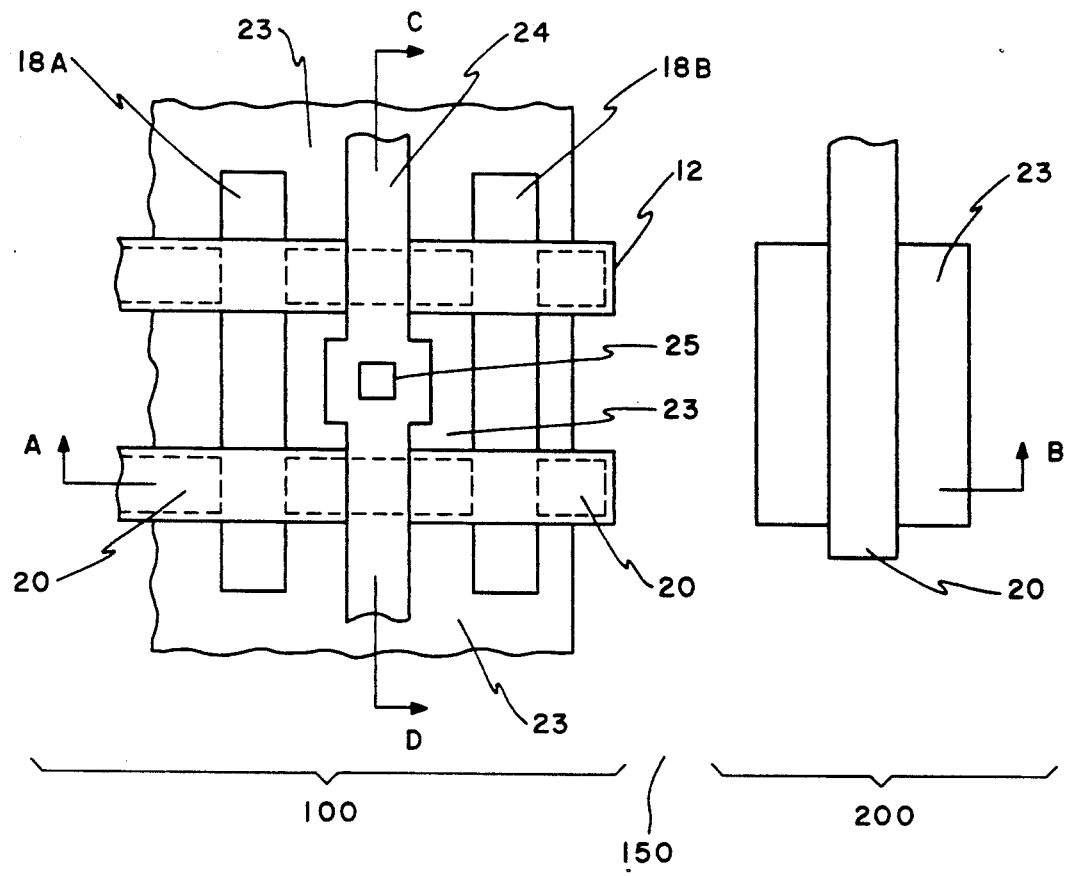
FIG. 7 is a plan view of the semiconductor device shown in FIG. 6.
Figure 8:
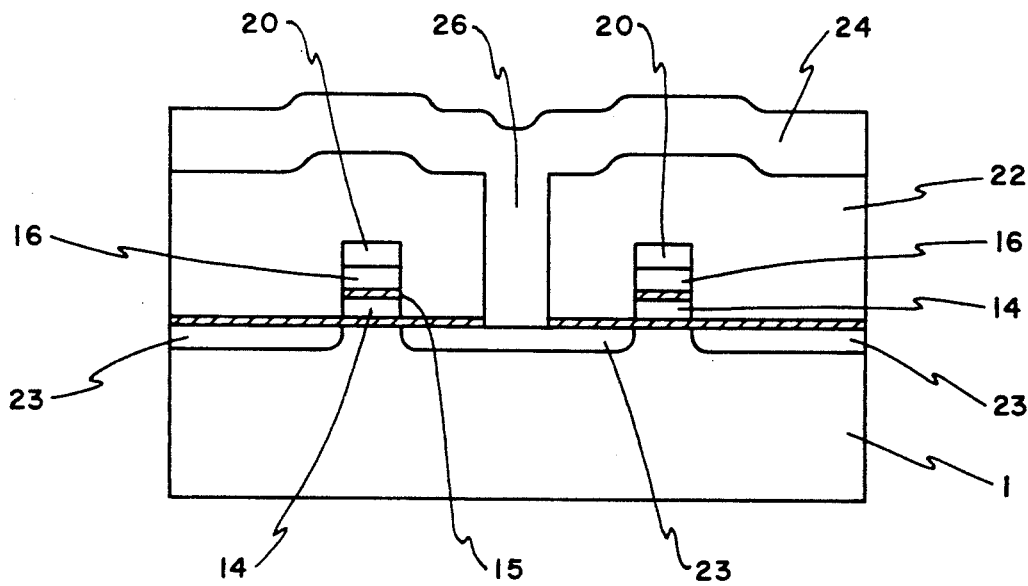
FIG. 8 is a cross section taken along a line C-D in FIG. 7.

FIGS. 1 to 6 show cross sections of a portion of a semiconductor wafer in various fabrication steps, according to an embodiment of the present invention, respectively. FIG. 7 is a plan view of a semiconductor device shown in FIG. 6. It is noted that the cross section shown in each of FIGS. 1 to 6 corresponds to a section taken along a line A-B in FIG. 7. FIG. 8 is a cross section taken along a line C-D in FIG. 7.

Figure 1:
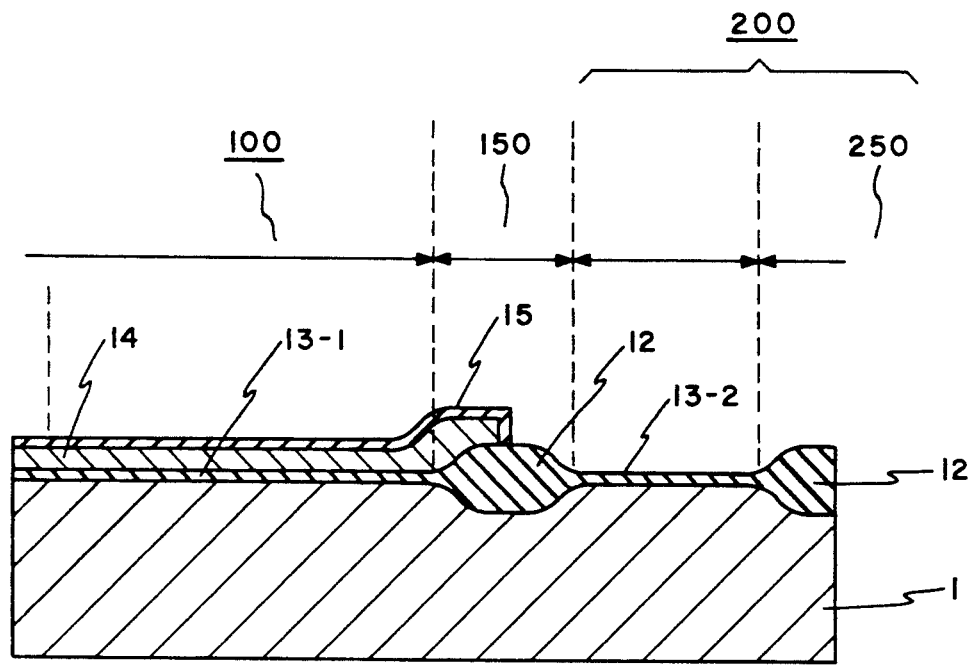
FIG. 1 to FIG. 6 are cross sectional views of a portion of a semiconductor device which is representative of manufacturing steps according to an embodiment of the present invention.

First, as shown in FIG. 1, a P-type silicon substrate 1 having a surface is prepared. Field SiO$_2$ films 12 are then formed, by the well-known selective oxidation technique. Film 12 extends through a field region 150 between a PROM cell region 100 and a peripheral circuit region 200 including an address input and decoder portion and a data input/output portion and in a field region 250 which is between adjacent transistors and within the peripheral circuit region 200.

The silicon substrate 1 contains boron at an impurity concentration of about 10$^{17}$ atoms/cm$^3$. Then, a first gate oxide film 13-1 for PROM cell transistors and a gate oxide film 13-2 for peripheral transistors, each having thickness of 200 Å, are formed by thermal oxidation at 900° C., respectively. Thereafter, a polysilicon film having thickness of 100 Å is formed over the entire surface by chemical vapor deposition (CVD). This polysilicon film is then patterned to form the floating gates of the PROM cells. An impurity is added to the film 14 before or after the formation thereof. Then, a second gate oxide film 15, having a thickness of 200 Å, is formed on the polysilicon oxide film 14 by a high temperature oxidation step, at 1000° C.

Figure 2:
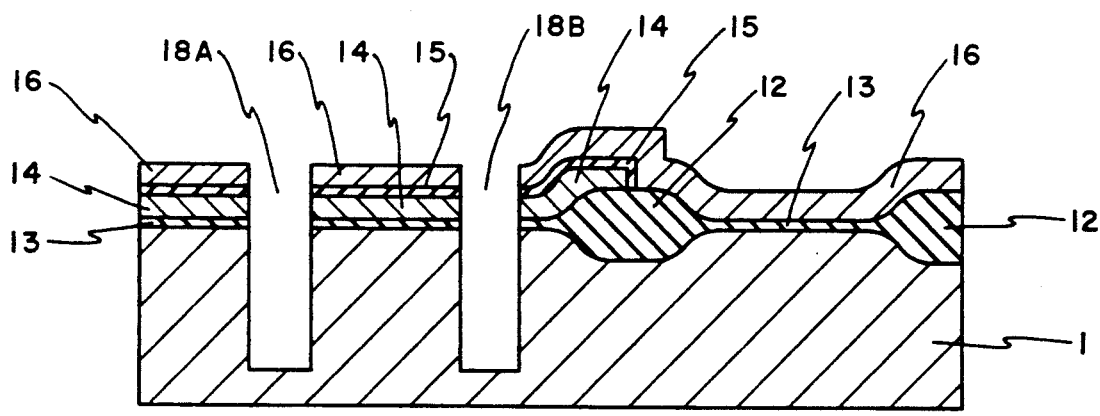

As shown in FIG. 2, a polysilicon film 16 having a thickness of 1000 Å is used as control gates of PROM cell transistors and as gates for peripheral MOS transistors. Film 16 is formed by CVD. An impurity is added thereto during or after the formation of this film 16. Then, the polysilicon film 16, the second gate insulating film 15, the polysilicon film 14, the first gate insulating film 13 and the P type silicon substrate 1 in the PROM cell forming region are selectively etched away by RIE to form trenches 18A and 18B (also see FIG. 7) for providing a separation between the respective PROM cell transistors. Each of the trenches 18A and 18B has width of 0.6 μm and depth of 1.2 to 1.5 μm. The aspect ratio thus becomes 2 to 2.5.

Figure 3:
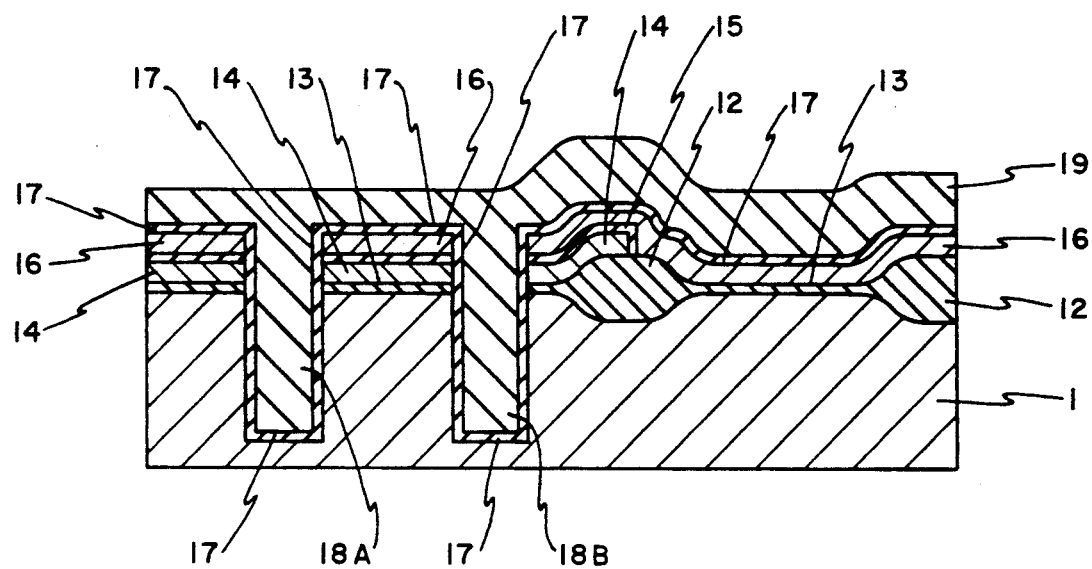

Thereafter, as shown in FIG. 3, a silicon dioxide film 17 having thickness of about 200 Å is formed by thermal oxidation at 900° C. over the whole surface of the wafer, including the inside and bottom surfaces of the trenches 18A and 18B. then, a BPSG film 19 containing boron at 8 mol % and phosphorus at 4 mol % is grown by CVD over the entire surface. A heat treatment is carried out at 900° C. for 30 minutes to fill the trenches 18A and 18B and to flatten or smooth the wafer surface.

Since the trenches 18 ar formed after the formations of the first and second gate oxide films 13 and 15 and the floating and control gates 14 and 17 and then the BPSG film 19 is formed and flattened, there is no degradation of gate insulating films 13 and 15 even if boron and/or phosphorus of the BPSG 19 is evaporated during the high temperature heat treatment.

Figure 4:
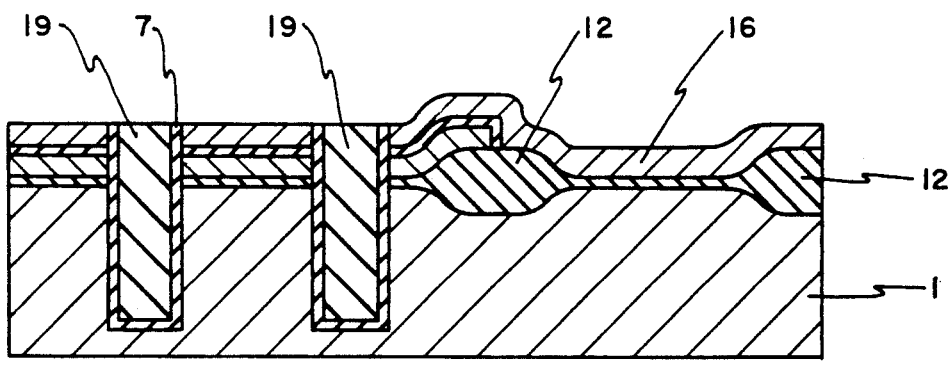

Then, as shown in FIG. 4, the BPSG film 19 and the underlying thermally oxidized silicon film 17 are etched back by the reactive-ion-etching (RIE) technique until the surface of the polysilicon film 16 is exposed. The BPSG film 19 thus remains in only the trenches 18A and 18B. At the termination of RIE, the surfaces of the BPSG 19 in the trenches and the polysilicon film 16 are substantially in a common plane, resulting in the surface of the PROM cell forming region 100 being flattened. This effect is obtained with the etching rate of the BPSG film 19 substantially equal to the etching rate of the thermally oxidized silicon film 17, which is realized in this embodiment by selecting concentrations of boron and phosphorus in the BPSG film as 8 mol % and 4 mol %, respectively.

It has been found that a similar effect can be obtained with concentrations of boron and phosphorus in ranges from 6 to 10 mol % and from 3 to 5 mol %, respectively. Thus, the flattening of the wafer surface can be realized through the single etching step. That is, there is no need of forming steps of the spacer polysilicon film 16 and the mask SiO$_2$ film 5 as required in the prior art technique and as shown in FIG. 9 The RIE step for the spacer polysilicon film 16 and the wet etching step for the ask SiO₂ film 5 in the prior art can be replaced by the single step in the present invention, thus reducing the number of fabricating steps.

Figure 5:
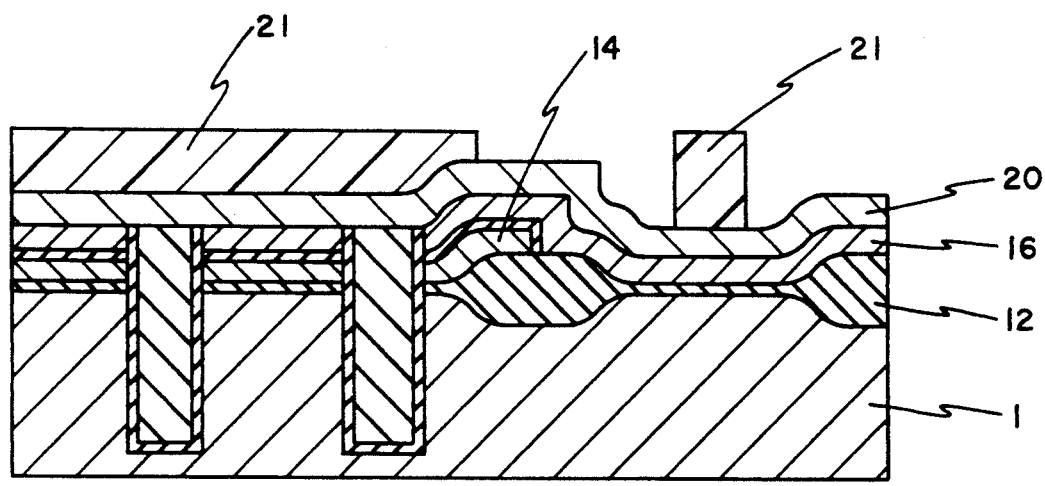

Then, as shown in FIG. 5, a tungsten silicide film 20 having thickness of about 1000 Å is formed over the entire surface of the wafer in order to lower the conductive resistance of the polysilicon film 16. Then, a photoresist film 21 is formed on the tungsten silicide film 20 and then patterned to cover portions operating as word lines of the PROM cells and as gates of the peripheral MOS transistor. It is noted that (the photoresist pattern 21 is the same as that of the tungsten silicide film 20 shown in FIG. 7). then, the tungsten silicide 20, the polysilicon film 16, the second gate insulating film 15 and the polysilicon film 14 are all etched away within the openings of the photoresist 21.

Figure 6:
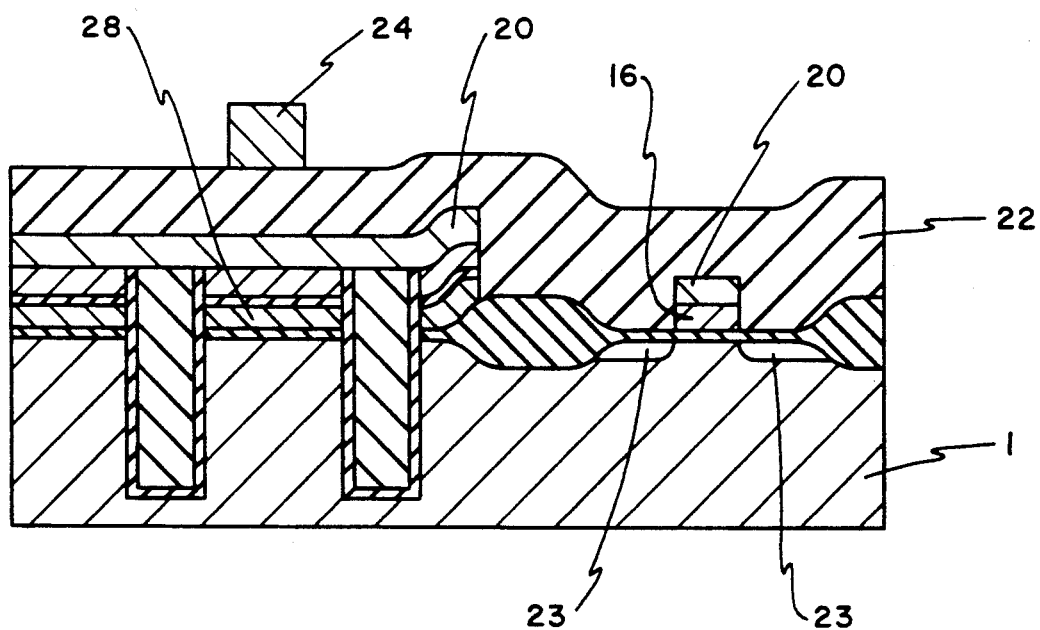

Then, as shown in FIG. 6 (and FIG. 7), N-type layers 23 (used as sources and drains of the peripheral MOS transistors and PROM cell transistors) are formed in the P type silicon substrate 1 by an ion-implantation of arsenide. FIG. 8 shows the layers 23 for sources and drains of the PROM cell transistors. Then, the photoresist film 21 (FIG. 5) is removed, followed by the formation of a BPSG film 22 as an insulating film for multi-level wirings. Then, the wafer is heat-treated for flattening its surface. Then, as shown in FIG. 7 and FIG. 8, a contact hole 26 is formed in the BPSG film 22, followed by forming a bit line 24 which is made of aluminum. The bit line 24 is in contact with the region 23, the contact being made through the contact hole 25.

Thus, a floating type PROM is fabricated with a trench isolation structure. The tungsten silicide film 20 and the polysilicon film 16 of the PROM cell are used as a word line and a control gate, respectively. The tungsten silicide film 20 and the polysilicon film 16 of the FET are used as a gate wiring and a gate, respectively.

Figure 9A:
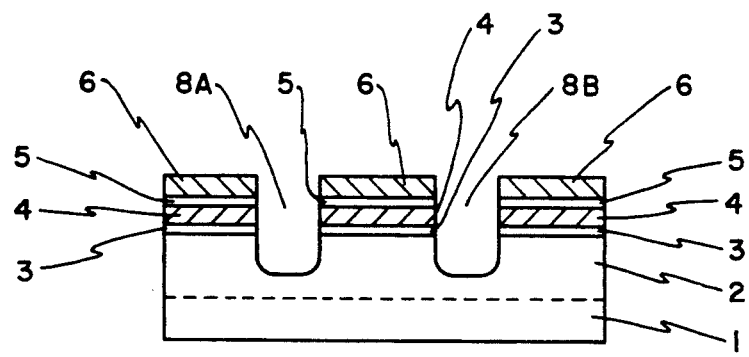
FIGS. 9A to 9E are cross sections showing fabricating steps according to a prior art.
Figure 9B:
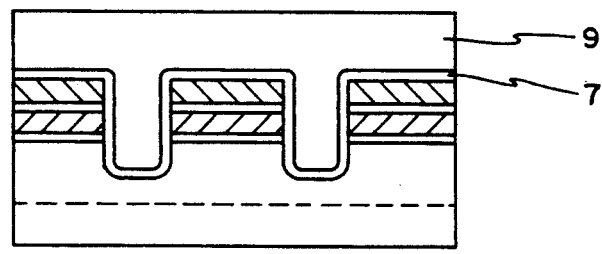
Figure 9C:
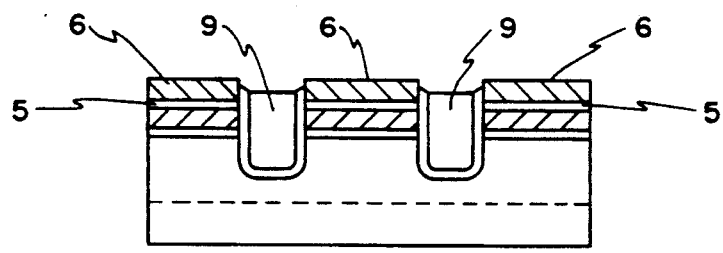
Figure 9D:
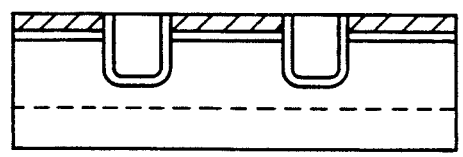
Figure 9E:
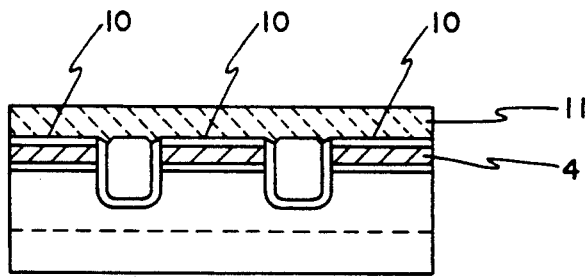
Figure 10:
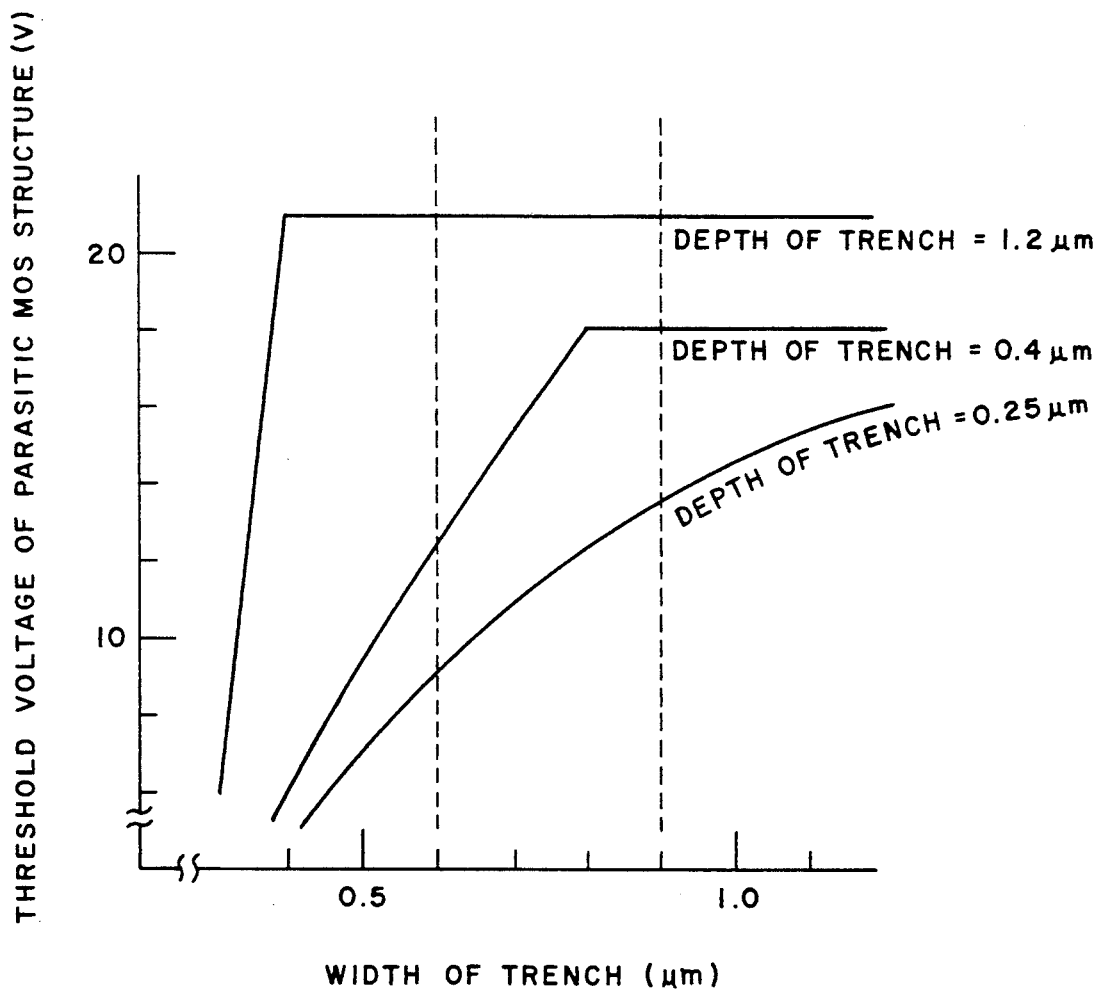
FIG. 10 is a graph showing a relation between trench width, trench depth and a parasitic MOS threshold value.
Figure 11:
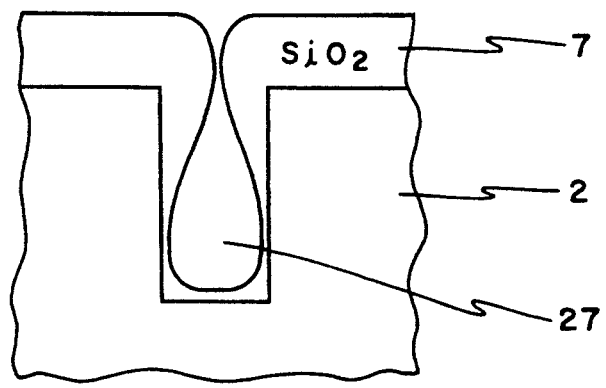
FIG. 11 illustrates a void left in a trench having aspect ratio of 2.0.

The tungsten silicide film 10 of FIG. 9E can thus be replaced by another metal which is selected from a group consisting of tungsten, molybdenum, titanium, chromium and tantalum or silicides thereof or platinum silicide.

Figure 12:
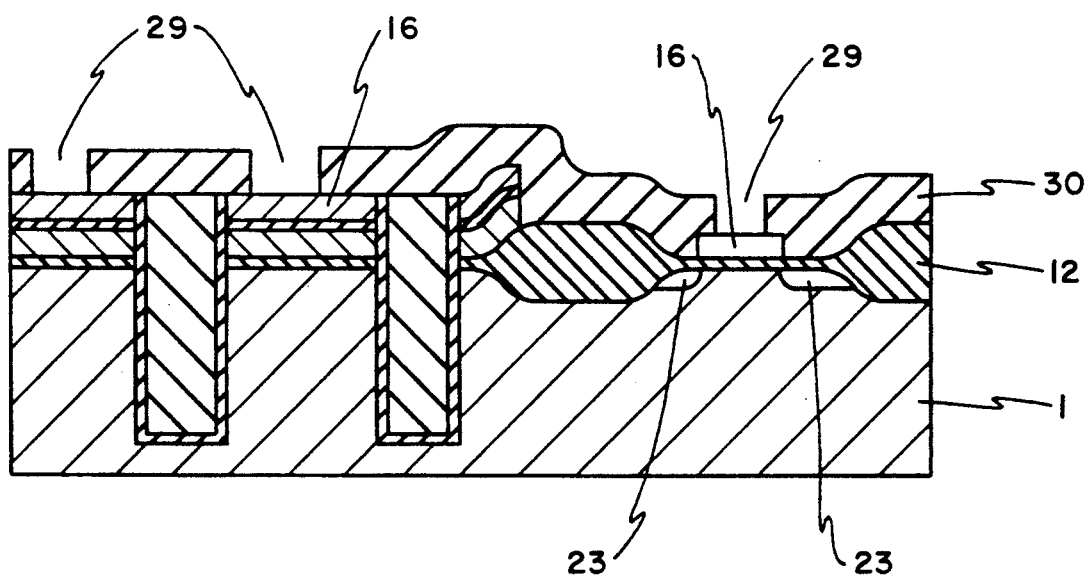
FIG. 12 to FIG. 14 are cross sections of a semiconductor device which is representative of fabrication steps according to another embodiment of the present invention.

Another embodiment of the present invention will be described with reference to FIGS. 12 to 14. In this embodiment, after the step shown in FIG. 4, the fabrication steps are different from the steps of the first embodiment.

More specifically, after the step shown in FIG. 4, the polysilicon layer 16 is patterned to form the gates of the peripheral transistors. The impurity regions 23 for sources and drains of the PROM cell transistors and the peripheral transistors are formed by an ion-implantation of arsenide, as shown in FIG. 12. Then a BPSG film 30 is formed by CVD as an inter-layer insulating film and is then patterned to form contact holes 29 to expose portions of the polysilicon control gate film 16 and is the gates of the peripheral transistors.

Figure 13:
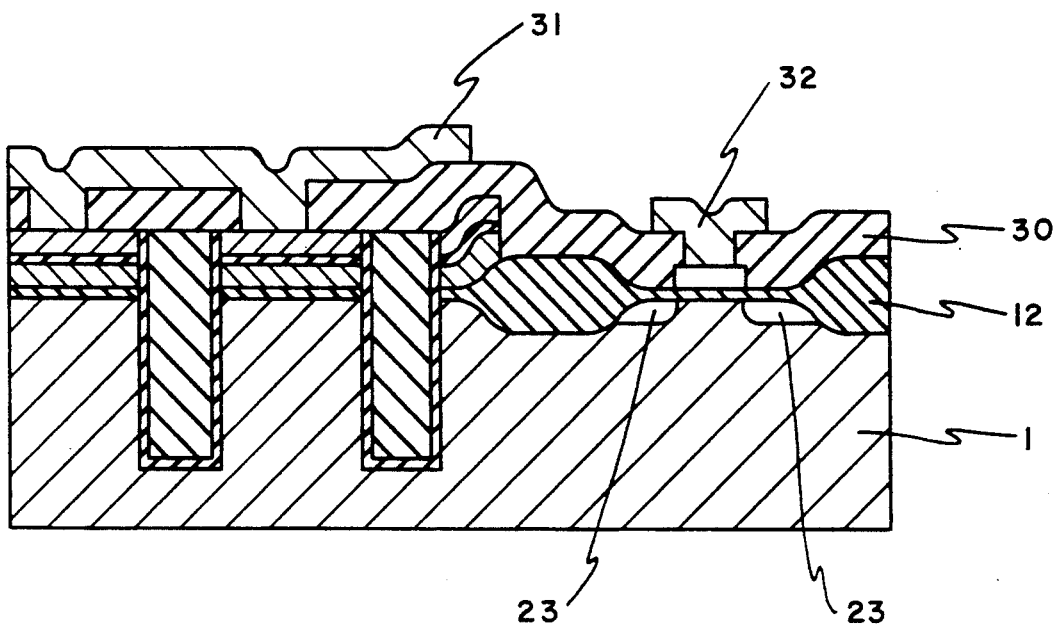

Then, as shown in FIG. 13, a tungsten silicide film having a thickness of about 1000 Å is formed and then patterned to form a word line 31 and agate line 32.

Figure 14:
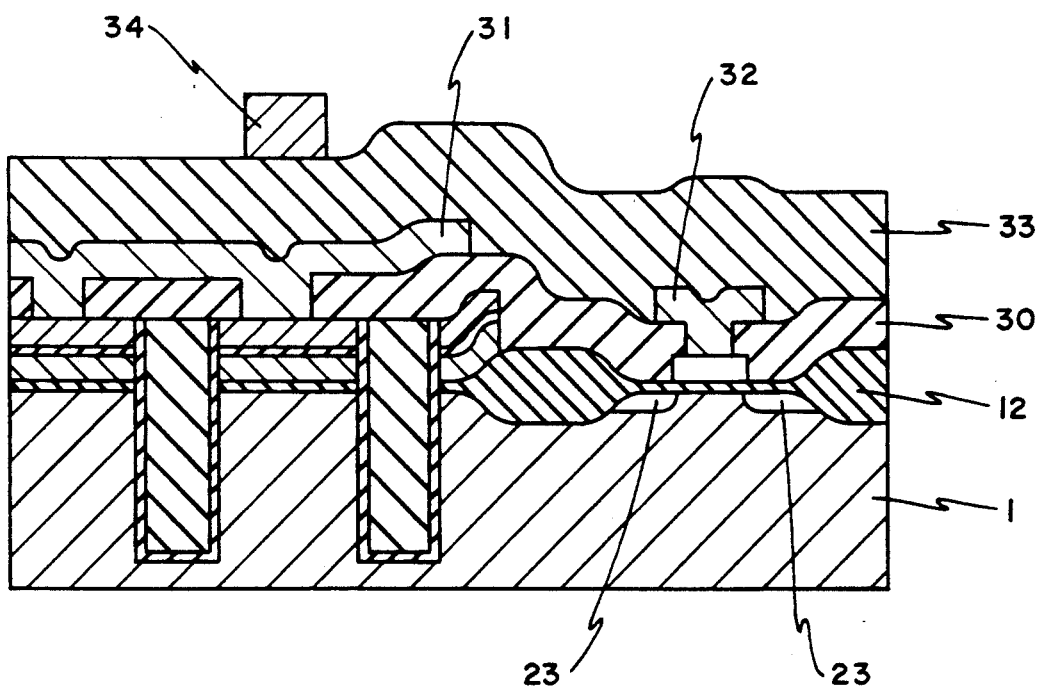

Then, as shown in FIG. 14, a BPSG film 3 is formed by CVD and an opening 25 is formed through the BPSG film 33 (see FIG. 7) to the drain region 23 of the PROM cell by lithography and etching techniques. Then, an aluminum bit line 34 is formed in contact with the drain region, through the opening 25.

The features and effects of the present invention will be summarized as follow:

The use of a BPSG film can completely fill the trenches having a large aspect ratio. Thus, it is possible to make a fine PROM fine as required by high density integration. The creation of a parasitic MOS transistor is prevented.

The trenches is filed with the BPSG film after the formation step of the gate insulating films. Therefore, boron and phosphor contained in the BPSG film is not taken into the gate insulating films of the PROM cell transistors.

Concentrations of boron and phosphorus in the BPSG film are selected such that the etching rate of the BPSG film becomes substantially equal to the etching rate of the silicon oxide film. Thus, the wafer surface can be flattened by a single etching step.

The present invention is not limited to the above embodiments, but may be modified and changed without departing from the spirit and scope of the invention.

What is claimed is:

1. A method of fabricating a semiconductor integrated circuit device, comprising the steps of:
    forming a first gate insulating film selectively on a main surface of a semiconductor substrate;
    forming a first polysilicon layer on said first gate insulating film;
    forming a second gate insulating film on the surface of said first polysilicon layer;
    forming a second polysilicon layer on said second gate insulating film;
    forming trenches for isolation of adjacent element sin said circuit by selectively removing said second polysilicon layer, said second gate insulating film, said first polysilicon layer, said first gate insulating film and said semiconductor substrate;
    forming a BPSG film over the entire resulting surface to fill said trenches; and
    selectively removing said BPSG film from said surface while leaving said BPSG film in said trenches.

2. The method as claimed i claim 1, further comprising the step of forming a silicon oxide film on the inner walls of said trenches and on said second polysilicon film before the step of forming said BPSG film is carried out, said BPSG film filling said trenches together with said silicon oxide film.

3. The method as claimed in claim 2, wherein said BPSG film contains boron in an amount of 6 to 10 mol % and phosphorus in an amount of 3 to 5 mol %.

4. A method of fabricating a semiconductor integrated circuit, comprising the steps of:
    forming a first gate insulating film selectively on a main surface of a semiconductor substrate;
    forming a first polysilicon layer on said first gate insulating film;
    forming a second gate insulating film on the surface of said first polysilicon layer;
    forming a second polysilicon layer on said second gate insulating film;
    forming trenches for isolating elements by selectively removing said second polysilicon layer, said second gate insulating film, said first polysilicon layer, said first gate insulating film and said semiconductor substrate;
    forming a BPSG film over the entire resulting surface to fill said trenches;
    selectively removing said BPSG film to leave said BPSG film in said trenches;

forming a word line in contact with said second polysilicon layer;

selectively etching, by using said work line as a mask, said second polysilicon layer, said second gate insulating film, and said first polysilicon layer;

forming an insulating layer having contact holes for exposing parts of said semiconductor substrate; and forming a bit line in contact with said parts of said semiconductor substrate through said contact holes.

5. A method of fabricating a semiconductor integrated circuit, comprising the steps of:

forming a first gate insulating film selectively on a main surface of a semiconductor substrate;

forming a first polysilicon layer on said first gate insulating film;

forming a second gate insulating film on the surface of said first polysilicon layer;

forming a second polysilicon layer on said second gate insulating film;

forming trenches for isolating elements by selectively removing said second polysilicon layer, said second gate insulating film, said first polysilicon layer, said first gate insulating film and said semiconductor substrate;

filling said trenches with a BPSG film;

forming an insulating layer having contact holes for exposing parts of said second polysilicon layer; and forming a word line in contact with said parts of said second polysilicon layer through said contact holes.

6. A method of fabricating a semiconductor device having a plurality of PROM cell transistors, comprising the steps of selectively forming on a semiconductor substrate a first gate insulating film for each of said PROM cell transistors, forming on said first gate insulating film a first polysilicon layer operating as a floating gate for each of said PROM cell transistors, forming on said first polysilicon layer a second gate insulating film for each of said PROM cell transistors, forming on said second gate insulating film a second polysilicon layer operating as a control gate for each of said PROM cell transistors, selectively removing said second polysilicon layer, said second gate insulating film, said first polysilicon layer, said first gate insulating film and said semiconductor substrates to form trenches for isolating said PROM cell transistors from one another, filling said trenches with a borophosphosilicate glass layer, and selectively etching said second polysilicon layer, said second gate insulating film and said first polysilicon layer to form the control gate, the floating gate, the second gate insulating film between the control and floating gates and the first gate insulating film between the floating gate and said semiconductor substrate for the respective ones of said PROM cell transistors.

7. The method as claimed in claim 6, further comprising the step of forming a conductive layer for connecting the control gates of the PROM cell transistors arranged in the same row.

8. A method of providing electrical isolation between devices on a semiconductor substrate, said method comprising the steps of;

successively growing gate insulating layers on said substrate;

covering each of said insulating layers with a polysilicon film, wherein beginning at said substrate said layers and films are: a first gate oxide film for peripheral transistors, a first polysilicon film, a second gate oxide film, and a second polysilicon film;

forming separation trenches through said layers and films and between said devices in order to isolate the devices from each other, whereby sections of said gate insulating layers and polysilicon films are isolated for form individual ones of said devices;

depositing BPSG on said substrate to form a film and fill said trenches, said second polysilicon film protecting said gate insulating layers from deterioration responsive to the deposit of said BPSG.

9. The method of claim 8 and the added step of selectively removing said BPSG film overlaying said substrate while retaining said BPSG in said trenches.

10. The method of claim 8 wherein said steps provide components in a configuration which forms PROM memory elements, and the added step of flattening the surface of said PROM elements in a single step of etching said second polysilicon film and said BPSG.

11. The method of claim 8 wherein said substrate is P-type silicon containing boron.

12. The method of claim 8 wherein said gate insulating layers are formed by thermal oxidation.

13. The method of claim 8 wherein said BPSG is deposited after any heat treatments have occurred which might otherwise evaporate phosphorus or boron contained in the BPSG.

* * * * *